United States Patent
Gao

(10) Patent No.: US 11,019,752 B2
(45) Date of Patent: May 25, 2021

(54) COOLING MODULE DESIGN FOR SERVERS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 0 days.

(21) Appl. No.: 16/447,703

(22) Filed: Jun. 20, 2019

(65) Prior Publication Data

US 2020/0404812 A1 Dec. 24, 2020

(51) Int. Cl.
*H05K 7/20* (2006.01)
*H05K 7/14* (2006.01)

(52) U.S. Cl.
CPC ....... *H05K 7/20772* (2013.01); *H05K 7/1488* (2013.01); *H05K 7/2079* (2013.01); *H05K 7/20254* (2013.01); *H05K 7/20272* (2013.01); *H05K 7/20781* (2013.01)

(58) Field of Classification Search
CPC .......... H05K 7/20627–20636; H05K 7/20763; H05K 7/20781; H05K 7/20254; H05K 7/20272
USPC .................................................. 361/699, 702
See application file for complete search history.

(56) References Cited

U.S. PATENT DOCUMENTS

| 7,190,580 B2* | 3/2007 | Bezama .................... F28F 3/12 165/80.4 |
| 7,298,617 B2* | 11/2007 | Campbell ........... H01L 23/4338 165/80.2 |
| 7,298,618 B2* | 11/2007 | Campbell ................. G06F 1/20 165/80.4 |
| 7,515,418 B2* | 4/2009 | Straznicky .......... H01L 23/4338 361/699 |
| 2005/0128705 A1* | 6/2005 | Chu ...................... H01L 23/473 361/699 |
| 2016/0143185 A1* | 5/2016 | Campbell .......... H05K 7/20254 361/699 |

* cited by examiner

*Primary Examiner* — Zachary Pape
(74) *Attorney, Agent, or Firm* — Womble Bond Dickinson (US) LLP

(57) ABSTRACT

In one embodiment, a cooling module includes a base frame, a fluid supply channel disposed on the base frame to receive cooling fluid from an external cooling fluid source, a fluid return channel disposed on the base frame to return the cooling fluid, multiple cold plates disposed on the base frame, wherein the cold plates are to be attached to a plurality of data processing modules. The cooling module also includes multiple distribution channels to distribute the cooling fluid received from the fluid supply channel to the cold plates to exchange heat generated by the heat generating modules and to return the cooling fluid carrying the exchanged heat back to the external cooling fluid source via the fluid return channel. The base frame, the fluid supply and return channels, the fluid distribution channels, and the cold plates are integrated as a single integrated cooling unit.

16 Claims, 9 Drawing Sheets

COOLING MODULE DESIGN FOR SERVERS

FIELD OF THE INVENTION

Embodiments of the present invention relate generally to data centers. More particularly, embodiments of the invention relate to cooling electronic racks in data centers.

BACKGROUND

Heat removal is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases as the temperature of their environment increases. Maintaining a proper thermal environment is critical for normal operations of these servers in data centers, as well as the server performance and lifetime. Heat removal solutions are necessary to cool these high performance servers.

Power intensive processors enable the solution of intensive computing such as deep learning. Electrical servers having those processors, i.e., high-power central processing units (CPUs) and/or general-purpose or graphical processing units (GPUs), have a very high power density per volumetric space. Liquid cooling is one thermal management solution for high power density.

In liquid cooling, a manifold is used for distributing and regulating fluid with main inlet/outlet ports and fluid sub-ports. The main inlet and outlet ports are connected to external cooling source, and the sub ports are connected with either server loops or cooling device loops. Conventional manifold designs are not efficient in some application scenarios.

As data centers become larger and more complex, thermal management becomes more challenging, given that high quality and reliability as well as low cost requirement. Traditional liquid cooling systems use hoses, valves, clamps, and barbs to transport cooling fluid from a cooling unit to heat generating components, such as GPUs, CPUs, processors, and other information technology (IT) components and equipment. Each connection between a hose and valve, clamp, or barb is an opportunity for fluid to leak. These connections between cooling system components are referred to herein as fluid connections. Leaking fluid may cause significant damage to the IT equipment. Reducing the number of fluid connections may result in fewer leaks in the cooling system. Therefore, it may be desirable to reduce the number of fluid connections in a cooling system.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details am not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

To reduce the number of fluid connections that need to be made to provide cooling fluid to IT components, a cooling module may be formed that has less of a need for fluid connections and parts. This may be possible by forming the cooling module as a single integrated unit. Instead of building a cooling system that has many fluid connections (e.g., hoses connecting to the manifold via clamps or other leak-prone connections), the cooling module contemplated herein may not require any internal connections. This may be accomplished in several ways: by machining fluid channels out from a base frame made of metal, through a mold, or through a form of permanently connecting fluid channels to a base frame (e.g., welding). In particular embodiments, the cooling module may include a base frame, a fluid supply channel disposed on the base frame to receive cooling fluid from an external cooling fluid source, a fluid return channel disposed on the base frame to return the cooling fluid, several cold plates disposed on the base frame, and several fluid distribution channels. The fluid distribution channels distribute the cooling fluid to heat generating processing modules, capture at least some of that heat, and return the exchanged heat in the form of warmer fluid back to the external cooling fluid source via the return channel. The base frame, the fluid supply and return channels, the fluid distribution channels, and the cold plates are integrated as a single integrated cooling unit.

Figure 1:
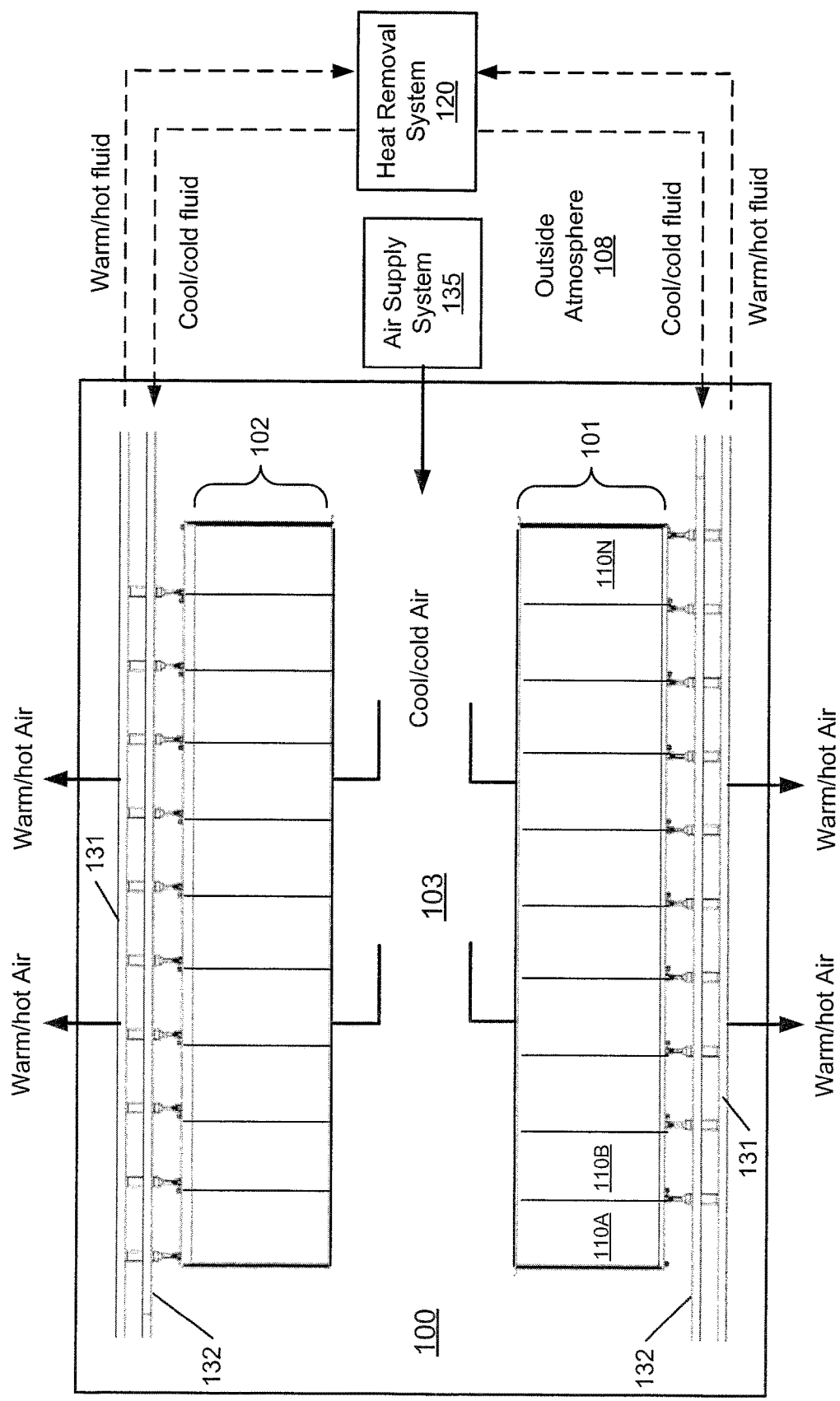
FIG. 1 is a block diagram illustrating an example of a data center facility according to one embodiment.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied.

In one embodiment, each of the electronic racks (e.g., electronic racks 110A-110N) includes a housing to house a number of electronic racks of IT components operating therein. The electronic racks can include a heat removal liquid manifold, including the integrated cooling module discussed herein, a number of server slots, and a number of server blades capable of being inserted into and removed from the server blades or server slots. Each server blade represents a computing node having one or more processors, a memory, and/or a persistent storage device (e.g., harddisk). At least one of the processors is attached to a liquid cold plate (also referred to as a cold plate assembly) to receive cooling liquid. In addition, one or more optional cooling fans are associated with the server blades to provide air cooling to the computing nodes contained therein. Note that the heat removal system 120 may be coupled to multiple data center systems such as data center system 100. The heat removal system removes a substantial amount of the heat generated within the data centers to the atmosphere.

In one embodiment, heat removal system 120 includes an external liquid loop connected to a cooling tower or a dry cooler external to the building/housing container. The heat removal system 120 can include, but is not limited to, evaporative cooling, free air, and rejection to large thermal mass and waste heat recovery designs. In this disclosure, heat removal system 120 may also be referred to as cooling system. Heat removal system 120 may include or be coupled to a cooling liquid source that provide cooling liquid.

In one embodiment, each server blade is coupled to the heat removal liquid manifold modularly such that a server blade can be removed from the electronic rack without affecting the operations of remaining server blades on the electronic rack and the heat removal liquid manifold. In another embodiment, each server blade is coupled to the heat removal liquid manifold (also referred to as a cooling liquid manifold) through a quick-release coupling assembly having a first liquid intake connector and a first liquid outlet connector coupled to a flexible hose to distribute the heat removal liquid to the processors. The first liquid intake connector is to receive heat removal liquid via a second liquid intake connector from a heat removal liquid manifold mounted on a backend of the electronic rack. The first liquid outlet connector is to emit warmer or hotter liquid carrying the heat exchanged from the processors to the heat removal liquid manifold via a second liquid outlet connector and then back to a coolant distribution unit (CDU) within the electronic rack.

In one embodiment, the heat removal liquid manifold disposed on the backend of each electronic rack is coupled to liquid supply line 132 to receive heat removal liquid (also referred to as cooling liquid) from heat removal system 120. The heat removal liquid is distributed through a liquid distribution loop attached to a cold plate assembly on which a processor is mounted to remove heat from the processors. A cold plate is configured similar to a heat sink with a liquid distribution tube or channel attached or embedded therein. The resulting warmer or hotter liquid carrying the heat exchanged from the processors is transmitted via liquid return line 131 back to heat removal system 120. Liquid supply/return lines 131-132 are referred to as data center or room liquid supply/return lines (e.g., global liquid supply/return lines), which supply heat removal liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server blades in the electronic rack to deliver the cooling liquid to the cold plates of the processors.

In one embodiment, data center system 100 further includes an optional airflow delivery system 135 to generate an airflow to cause the airflow to travel through the air space of the server blades of the electronic racks to exchange heat generated by the computing nodes due to operations of the computing nodes (e.g., servers) and to exhaust the airflow exchanged heat to an external environment 108 outside of housing/room/building. For example, air supply system 135 generates airflow of cool/cold air to circulate from aisle 103 through electronic racks 110A-110N to carry away exchanged heat. The cool airflows enter the electronic racks through their frontends and the warm/hot airflows exit the electronic racks from their backends. The warm/hot air with exchanged heat is exhausted from room/building. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling. Air supply system 135 can be connected to the heat removal system 120 to extract the heat to the atmosphere.

Figure 2:
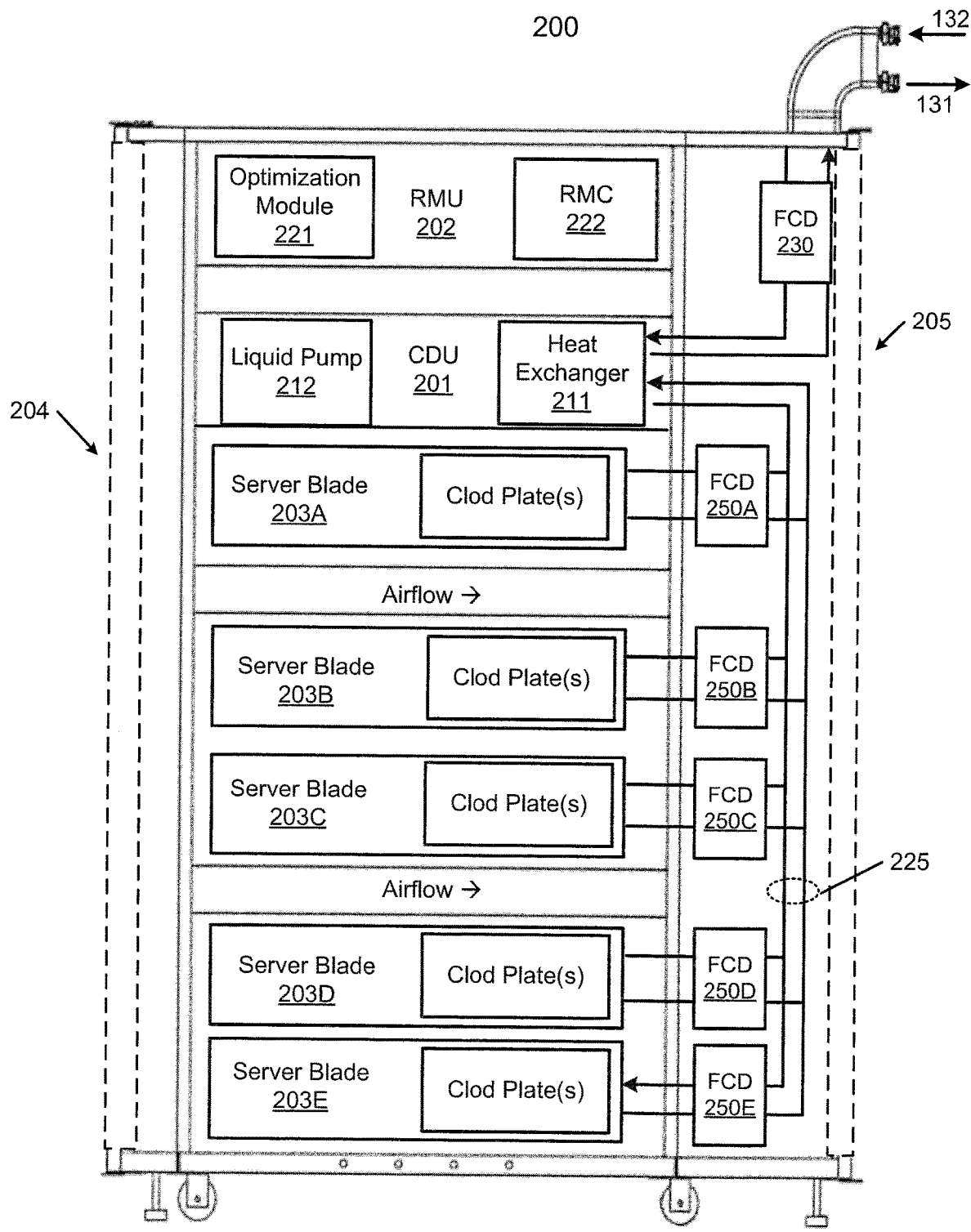
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, optional CDU 201, RMU 202, and one or more server blades 203A-203E (collectively referred to as server blades 203). Server blades 203 can be inserted into an array of server slots respectively from frontend 204 or backend 205 of electronic rack 200. Note that although there are five server blades 203A-203E shown here, more or fewer server blades may be maintained within electronic rack 200. Also note that the particular positions of CDU 201, RMU 702, and server blades 203 are shown for the purpose of illustration only; other arrangements or configurations of CDU 201, RMU 202, and server blades 203 may also be implemented. In one embodiment, electronic rack 200 can be either open to the environment or partially contained by a rack container, as long as the cooling fans can generate airflows from the frontend to the backend.

In addition, for at least some of the server blades 203, an optional fan module (not shown) is associated with the server blade. Each of the fan modules includes one or more cooling fans. The fan modules may be mounted on the backends of server blades 203 or on the electronic rack to generate airflows flowing from frontend 204, traveling through the air space of the sever blades 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, are coupled to heat removal system 120 as described above. In addition, heat exchanger 211 further includes a second loop with two ports having a second pair of liquid connectors coupled to liquid manifold 225 to form a secondary loop, which may include a supply manifold (also referred to as a rack liquid supply line) to supply cooling liquid to server blades 203 and a return manifold (also referred to as a rack liquid return line) to return warmer liquid back to CDU 201. Note that CDUs 201 can be any kind of CDUs commercially available or customized ones. Thus, the details of CDUs 201 will not be described herein.

Each of server blades 203 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 200 may optionally further include RMU 202 configured to provide and manage power supplied to servers 203 and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery unit, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and air temperatures, which may be captured and collected via various temperature sensors. The monitor may also receive data representing the fan power and pump power generated by the fan modules and liquid pump 212, which may be proportional to their respective speeds. These operating data are referred to as real-time operating data. Further, the monitor may further receive signals indicating whether liquid leak occurs in any of the server blades, for example from leak detectors and/or sensors (e.g., liquid sensors, temperature sensors). Note that the monitor may be implemented as a separate module within RMU 202.

Based on the operating data, optimization module 221 performs an optimization using a predetermined optimization function or optimization model to derive a set of optimal fan speeds for fan modules and an optimal pump speed for liquid pump 212, such that the total power consumption of liquid pump 212 and the fan modules reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of fan modules 231 based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server blades 203. Similarly, based on the optimal fan speeds, RMC 222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

As described above, each of the server blades includes a number of IT components such as processors or processing units that may generate heat during the operations. According to one embodiment, the IT components of each server blade are attached to an integrated cooling module having an array of cold plates arranged therein to be attached to an external surface of each of the IT components for heat exchange. The integrated cooling module is designed to be a single cooling module having cooling liquid distribution channels embedded therein to reduce a number of connection joints and parts, which in turn reduces the chances of liquid leaking, which will be described in details further below.

Figure 3:
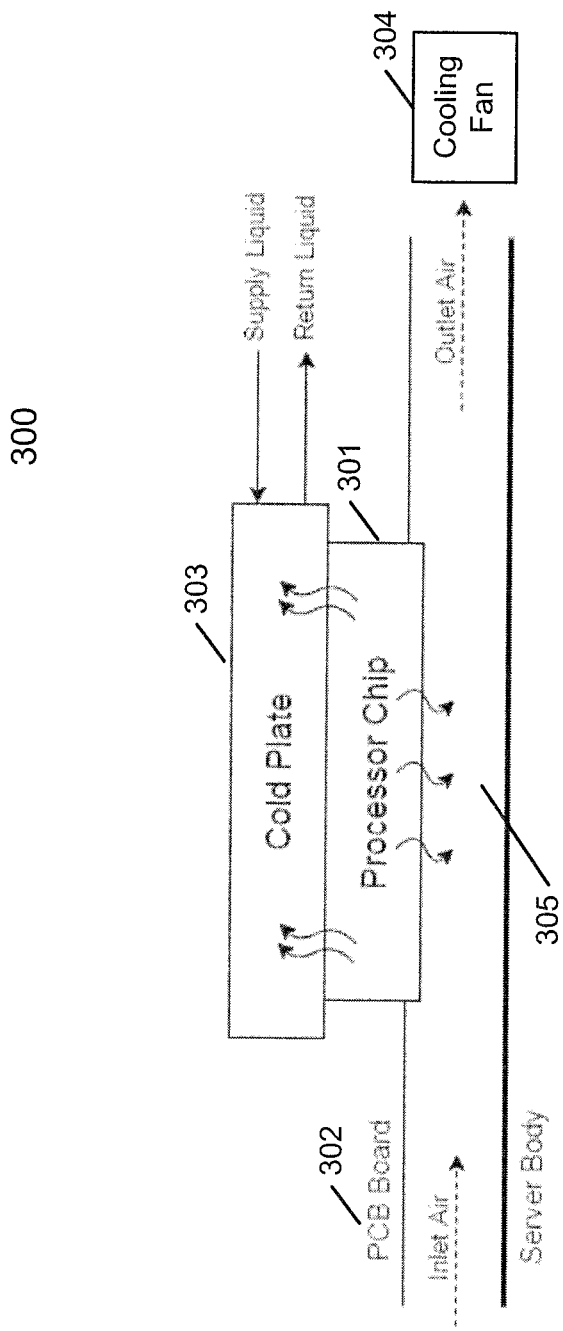
FIG. 3 is a block diagram illustrating an example of a cold plate configuration according to one embodiment.

FIG. 3 is a block diagram illustrating a processor cold plate configuration according to one embodiment. The processor/cold plate structure 300 can represent any of the processors/cold plate structures of server blades 203 as shown in FIG. 2. Referring to FIG. 3, processor 301 is plugged onto a processor socket mounted on printed circuit board (PCB) or motherboard 302 coupled to other electrical components or circuits of a data processing system or server. Processor 301 also includes a cold plate 303 attached to it, which is coupled to liquid supply line 132 and liquid return line 131. A portion of the heat generated by processor 301 is removed by the cooling liquid via cold plate 303. The remaining portion of the heat enters into air space 305 underneath, which may be removed by an airflow generated by cooling fan 304.

Referring back to FIG. 2, according to one embodiment, electronic rack 200 may optionally include a rack flow control device (FCD) 230 coupled to RMU 202 and at least the rack liquid supply line and/or the rack liquid return line to control the amount of cooling liquid flowing to the sever blades 203. Each of the server blades 203 further includes a leak detector or leak detection system (not shown) to detect liquid leak within the server blade. A leak detector can be any liquid leak detectors.

According to another embodiment, each of the server blades 203 may optionally include or be associated with a server FCD such as server FCDs 250A-250E (collectively referred to as server FCDs 250) between rack manifold 225 and server blades 203. Each of the server FCD 250 is configured to control the flow volume of cooling liquid flowing into the sever blades 203. As described above, each server blade includes a server liquid supply line coupled to the rack supply line and a server liquid return line coupled to the rack return line. The server liquid supply line is coupled to one end of the server liquid distribution loop and the server liquid return line is coupled to the other end of the server liquid distribution loop, such that the cooling liquid is looping through the distribution loop for heat exchange. Each of server FCDs is coupled to RMC 222 and can be controlled by RMC 222.

Figure 4:
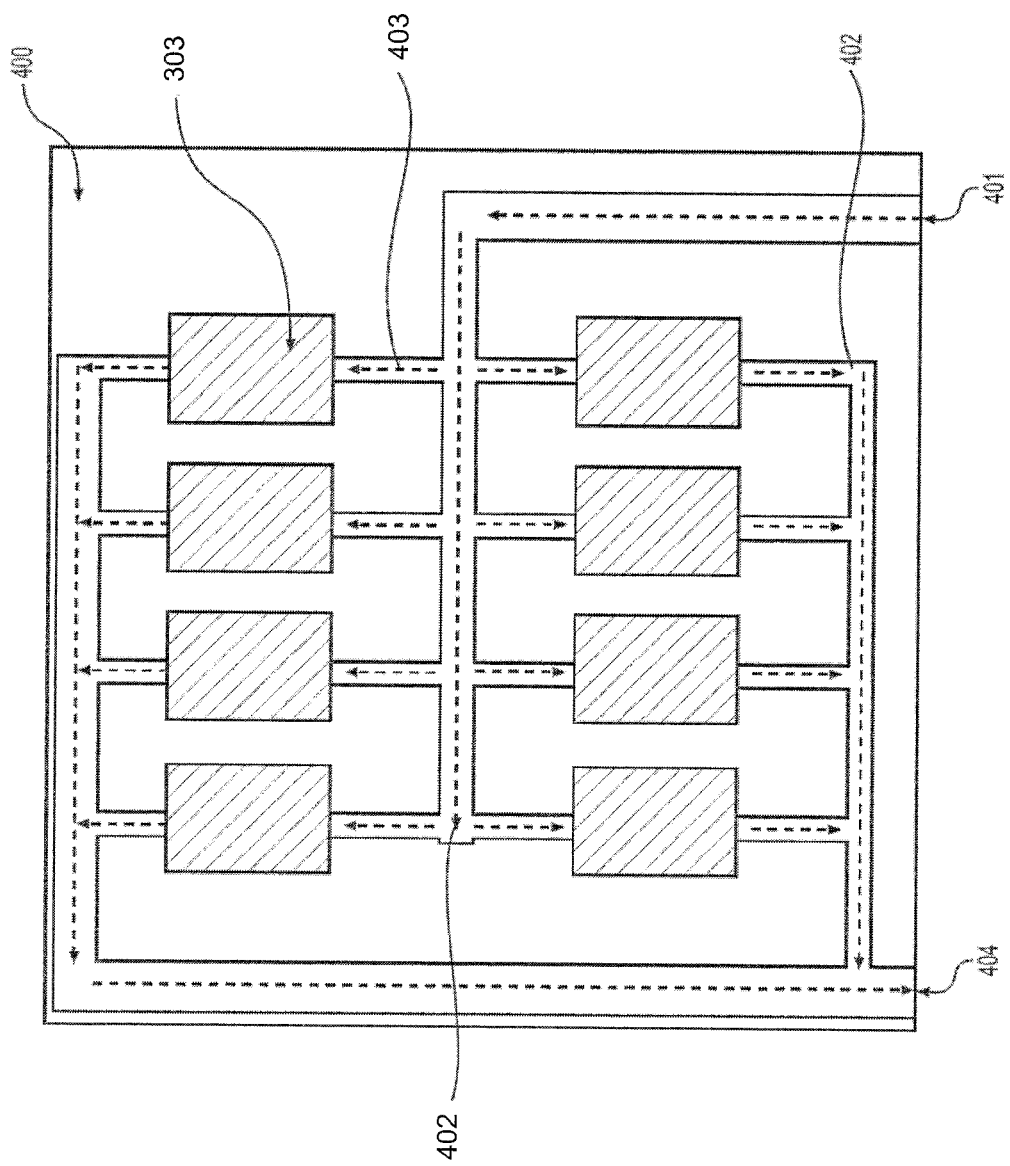
FIG. 4 illustrates an example cooling module with cold plates arranged in parallel.
Figure 6:
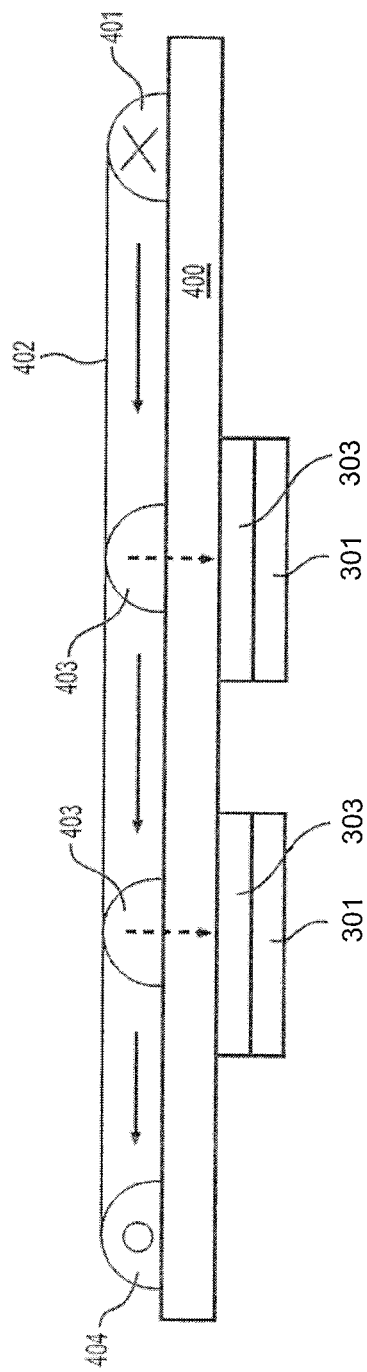
FIG. 6 illustrates an example cooling module according to another embodiment.
Figure 7:
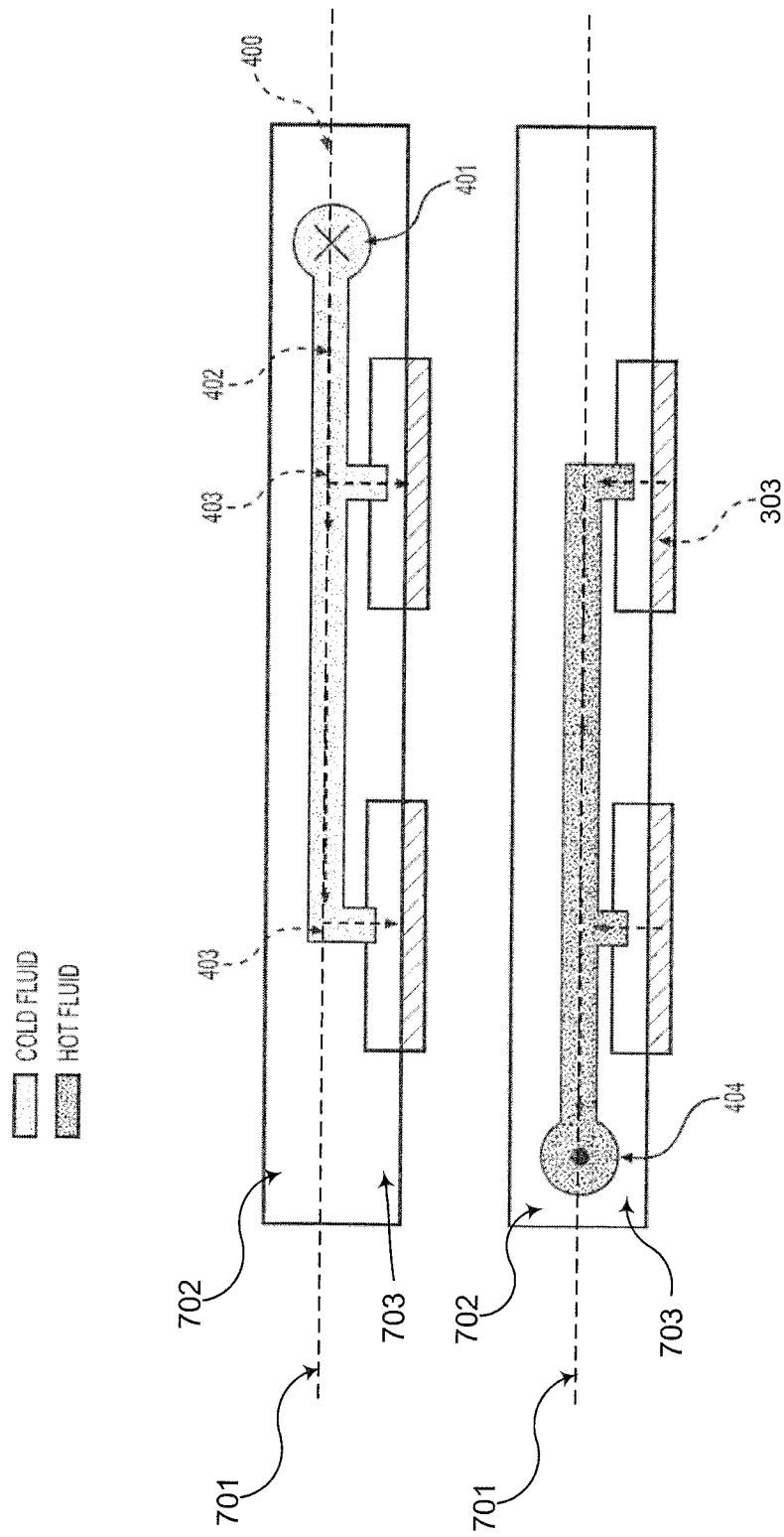
FIG. 7 illustrates an example cooling module according to another embodiment.

FIG. 4 illustrates a top view of an example cooling module with cold plates arranged in parallel. In particular embodiments, an integrated cooling module may be attached to the IT components of any one of the server blades as shown in FIG. 2 by matching the cold plates with the specific layout or arrangement of the IT components. The cooling module may include a base frame 400, fluid supply channel 401, fluid return channel 404, manifold 402, and several fluid distribution channels 403. Side views of two different embodiments of a cooling module are illustrated in FIGS. 6 and 7. As is illustrated by FIG. 4, the cooling module is integrated as a single integrated unit. Being integrated as a single integrated unit may mean that the cooling module is made of a single piece of material, or that the cooling module is made from separate pieces but permanently joined together via a permanent coupling such as welding. In either embodiment, there may be no or very few fluid connections between the manifold 404 and the fluid distribution channels 403, or between any of the other parts of the cooling module 400. The only places where a fluid connection may be needed are at the entry of the fluid supply channel 401 and the end of the fluid return channel 404.

In one embodiment, the cooling module may be made of a heat conductive material and formed in a single piece without having to use more connectors. The material may be any material suitable for cooling IT equipment, such as aluminum, copper, steel, titanium, or any other suitable material. If made from a single material, the cooling module may originally start out as a block of material (e.g., aluminum). The fluid channels (e.g., fluid supply channel, fluid return channel, manifold, fluid distribution channels) may be machined or molded into the cooling module such that the finished product is one unit with no internal fluid connections. The only fluid connections may be located at the fluid supply channel 401 and the fluid return channel 404. Reducing the number of fluid connections may reduce the potential for leaks that can occur in or around the cooling module.

In one embodiment, the cooling module may be made of several pieces of material. In some embodiments, the several pieces of material will still be the same material. For example, all the pieces of the cooling module may be aluminum. The pieces may be formed separately and then permanently joined together once they have been formed. For example, the fluid distribution channels 403, the manifold 402, the fluid supply channel 401, and the fluid return channel 404 may all be constructed separately and then coupled to the cooling module 400 with a permanent coupling such as welding. This reduces the number of fluid connections and may also significantly reduce the potential for leaks in and around the cooling module.

Figure 5:
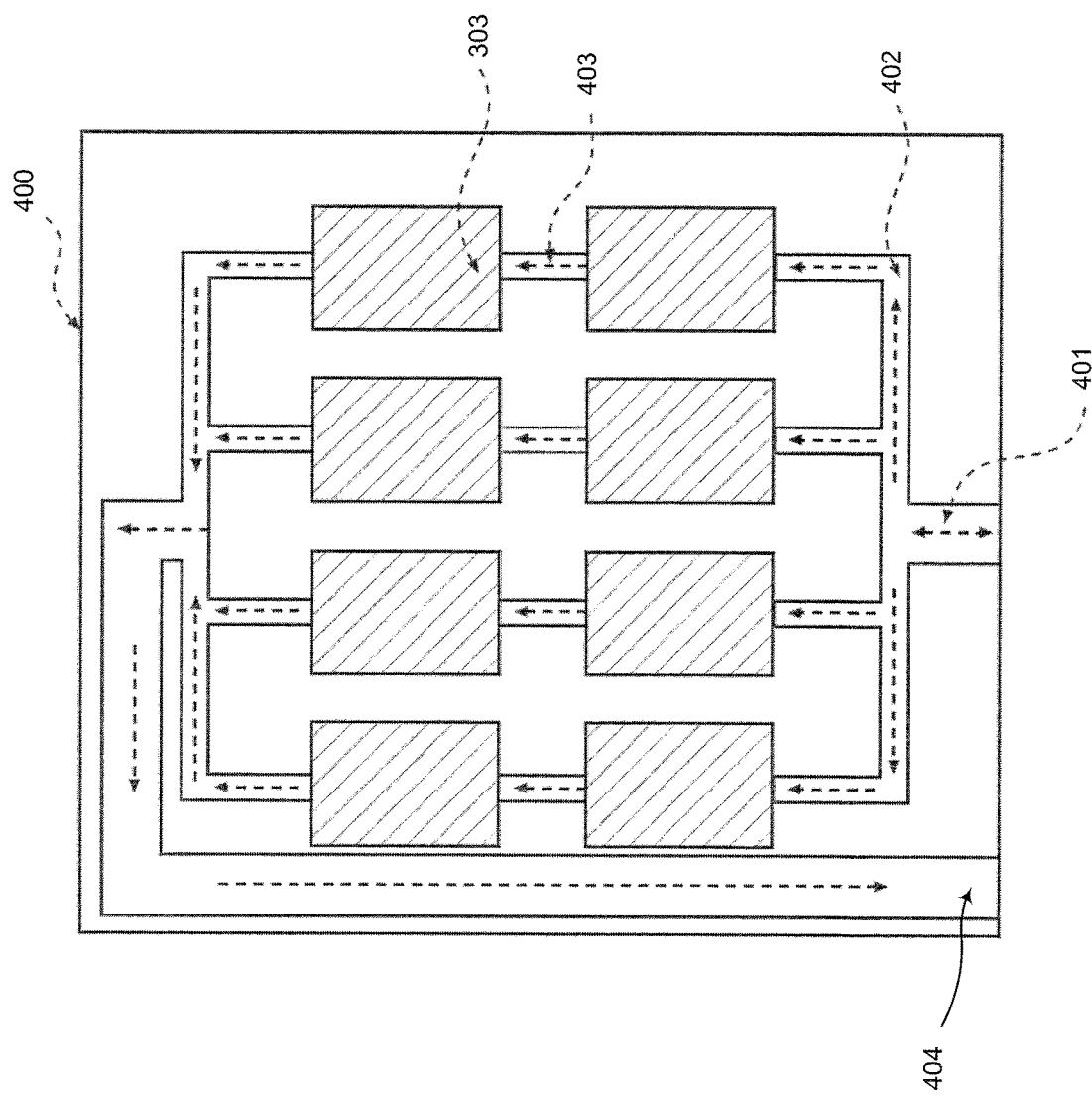
FIG. 5 illustrates an example cooling module with cold plates arranged in series.

FIG. 5 illustrates an example of a cooling module with every two cold plates 303 arranged in series. The cold plates 303 may either be machined into the cooling module similar to how the distribution channels 403 may be machined, or cold plates 303 may be pre-manufactured and coupled to the plurality of distribution channels via a permanent coupling. In particular embodiments, cold fluid enters fluid supply channel 401. The cold fluid may be provided by an external cooling fluid source. As the cold fluid travels through fluid supply channel 401, manifold 402, and fluid distribution channels 403, the cold fluid may capture some of the heat generated by the electronic components which are not illustrated but which are positioned adjacent to cold plates 303. The cooling fluid warms up as it absorbs the heat from the IT components. The warmer fluid then exits the manifold via return channel 404 taking a significant amount of heat with it. In some embodiments, the cold plates may be manufactured separately from the cooling module and may be removably coupled to the cooling module via any suitable means for coupling cold plates to cooling systems. In the illustration of FIG. 4, the cold plates are arranged in parallel, meaning that the cooling fluid enters manifold 402 and is substantially evenly dispersed between the distribution channels 403. The cooling fluid may enter each distribution channel 403 and thus each cold plate 303 at roughly the same time. This parallel design allows the IT components to be cool substantially evenly.

In contrast to the parallel design depicted in FIG. 4, a series design is illustrated in FIG. 5 according to an alternative embodiment. In a series design, cold plates 303 may be thought of as being divided into a first group and a second group. In the series arrangement, the first group of cold plates may be located closer to supply channel 401 and manifold 402 than the second group of cold plates. To reach the second group of cold plates, fluid must first pass the first group of cold plates. As it passes the first group of cold plates, it warms because it captures some of the heat generated by the IT components. Thus when the fluid arrives at the second group of cold plates, it is warmer than when it arrived at the first group of cold plates.

FIG. 6 illustrates a an example cooling module whose manifold 402 and distribution channels 403 (or some portion of the 402 and 403) are on top of base frame 400 rather than inside base frame 400. In this embodiment, manifold 402, distribution channels 403, fluid supply channel 401, and fluid return channel 404, (collectively, "fluid channels") may not be machined into base frame 400. Instead, the fluid channels may be formed in some other way, such as pre-forming and pre-assembling the fluid channels and then permanently coupling the fluid channels to base frame 400, such that the fluid channels are located above a top surface of base frame 400. This embodiment may accomplish the same or similar purpose as the machined fluid channels illustrated in FIG. 4 in that the permanently coupled fluid channels have smaller potential for leaks because there are fewer fluid connections than traditional cooling modules. Also illustrated in FIG. 6 are cold plates 303 and IT components 301. The cooling fluid enters the cooling module through fluid supply channel 401, passes through manifold 402, and travels down distribution channels 403. As it travels down distribution channels 403, it passes cold plates 303, which act as heat sinks for the IT components 301 by drawing up the heat generated by IT components 301 and transferring that heat to the cooling fluid. The cooling fluid warms up as it absorbs the heat from the IT components. The warmer fluid then exits the manifold via return channel 404.

FIG. 7 illustrates an example cooling module whose fluid distribution channels are located within base frame 400. The embodiment illustrated by FIG. 7 may be a side view of the embodiment illustrated in FIG. 4. In FIG. 7, fluid supply channel 401, fluid return channel 404, manifold 402, and distribution channels 403 may be all contained inside, or under a top surface of, base frame 400. The fluid channels in this embodiment may be formed via machining or any other suitable means. For example, the base frame 400 may be molded as two separate pieces: a top portion 702 and a bottom portion 703, which may be divided along line 701. After top portion 702 and bottom portion 703 have been formed, they may be permanently joined together fully sealed after the initial molding of each portion. Thus, the cooling module may be formed as a result of both machining and permanent coupling.

Figure 8:
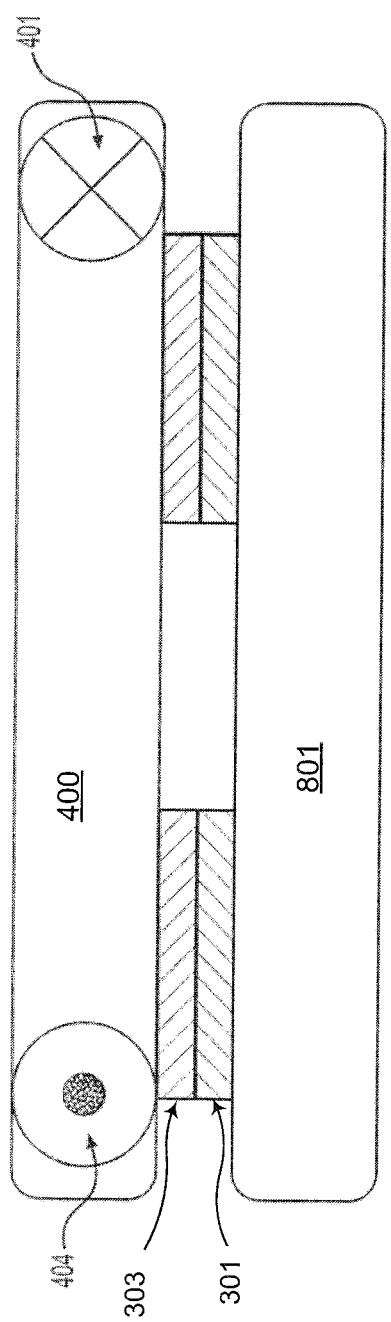
FIG. 8 illustrates an example cooling module and IT components according to one embodiment.

FIG. 8 illustrates an example cooling module, IT components 301, and printed circuit board (PCB) 801. Base plate 400, fluid supply channel 401, fluid return channel 404, and cold plates 303 may be integrated as a single integrated unit. The single integrated unit may be coupled to IT components 301, which may be attached to PCB 801.

Figure 9:
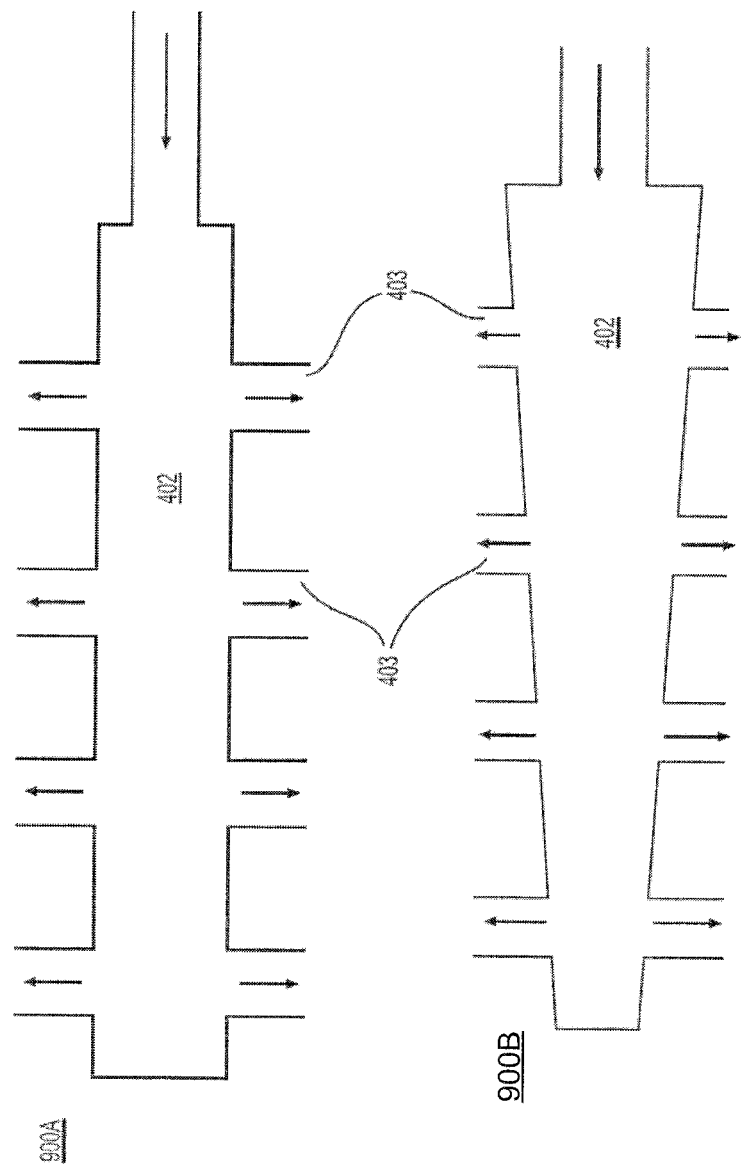
FIG. 9 illustrates a first and a second manifold geometry.

FIG. 9 illustrates a first example manifold geometry 900A and a second example manifold geometry 900B using tapered design. It may be desirable for the cooling fluid to enter each of the plurality of fluid supply channels 403 at approximately the same time. However, it may not achieve a same rate of mass outflow through each of the exit ports of a distribution manifold. If the fluid enters a manifold from the right, where the manifold has the first manifold geometry 900A, the fluid may enter the leftmost fluid distribution channels 403 before entering the rightmost fluid distribution channels (not labeled), which results in nonuniform flow distribution. It may be beneficial to avoid such a scenario because the IT components may not be cooled uniformly. For example, if most of the cooling fluid enters the leftmost fluid distribution channels and relatively less cooling fluid enters the rightmost channels, the IT components located adjacent to the leftmost channels will be cooled better than the IT components located adjacent to the rightmost channels. Thus, it may be desirable to provide a way for the fluid to enter all the fluid distribution channels at approximately the same time. Fluid entering the fluid supply channels at approximately the same time may help to keep all the IT components at approximately the same temperature.

A manifold having the geometry using nonuniform tapered longitudinal section design of manifold 900B may help to overcome the above discussed problem. Manifold geometry 900B has a tapered geometry such that the manifold narrows in the same direction as fluid flow. This may enable fluid to enter the leftmost fluid distribution channels at approximately the same time as the fluid enters the rightmost fluid distribution channels. Fluid may enter a manifold having geometry 900B and may be subject to a particular fluid pressure. The taper may have a particular grade that is suitable to enable the fluid, given its fluid pressure, to enter the distribution channels at approximately with same amount. In this way, all the IT components coupled to the fluid cooling module may be cooled approximately evenly.

In some embodiments, the cooling module may be adapted for use inside an autonomous vehicle. An autonomous vehicle may require significant processing power as it navigates throughout city, residential, or rural streets. Image recognition, obstacle avoidance, managing rider preferences, and similar tasks may be performed by processors on the vehicle, as opposed to processors located at a remote server. The processors located on the vehicle may be densely packed and may thus generate increasing amounts of heat. To capture at least some of the heat generated by these processors, a cooling module according to any of the embodiments discussed herein may be installed in the autonomous vehicle adjacent to at least some IT components. For example, the IT components may be located in the trunk of the autonomous vehicle and the cooling module may be installed in the trunk adjacent to at least some of the IT components. Thus, the cooling system in the autonomous vehicle may be subject to a smaller leak potential because it has fewer fluid connections compared to traditional cooling systems.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling module, comprising:
 a base frame;
 a fluid supply channel disposed on the base frame to receive cooling fluid from an external cooling fluid source, wherein the fluid supply channel comprises a tapered manifold that narrows in the direction of fluid flow;
 a fluid return channel disposed on the base frame to return the cooling fluid;
 a plurality of cold plates disposed on a bottom surface of the base frame, wherein the cold plates are to be attached to a plurality of data processing modules; and
 a plurality of fluid distribution channels disposed on a top surface of the base frame to distribute the cooling fluid received from the fluid supply channel to the cold plates to exchange heat generated by the data processing modules and to return the cooling fluid carrying the exchanged heat back to the external cooling fluid source via the fluid return channel, wherein the base frame, the fluid supply and return channels, the fluid distribution channels, and the cold plates are integrated as a single integrated cooling unit comprised of a single piece of material, and wherein all fluid distribution channel connections are internal to the base frame and the fluid supply channel and the fluid return channel are the only external fluid connections to the plurality of fluid distribution channels.

2. The cooling module of claim 1, wherein the base frame, the fluid supply channel, the fluid return channel, the plurality of cold plates, and the plurality of fluid distribution channels are formed from a single material.

3. The cooling module of claim 2, wherein the single material comprises aluminum, copper, steel, or titanium.

4. The cooling module of claim 1, wherein the plurality of cold plates are coupled to the plurality of distribution channels via a permanent coupling.

5. The cooling module of claim 1, wherein the plurality of fluid distribution channels are located above a top surface of the base frame.

6. The cooling module of claim 1, wherein the cooling module is adapted for use inside an autonomous vehicle.

7. The cooling module of claim 1, wherein the plurality of cold plates are arranged in series on the cooling module, such that the cooling fluid passes a first group of cold plates before passing a second group of cold plates.

8. The cooling module of claim 1, wherein the plurality of cold plates are arranged in parallel on the cooling module, such that the cooling fluid passes each of the plurality of cold plates at substantially the same time.

9. An electronic rack, comprising:
a rack manifold having a rack liquid supply line to receive cooling liquid from a cooling liquid source and a rack liquid return line to return warmer liquid back to the cooling liquid source; and
a plurality of server blades arranged in a stack, wherein each of the server blades includes a plurality of data processing modules and a cooling module attached to the data processing modules for heat exchanges, wherein the cooling module comprises a base frame,
a fluid supply channel disposed on the base frame to receive cooling fluid from the rack liquid supply line, wherein the fluid supply channel comprises a tapered manifold that narrows in the direction of fluid flow,
a fluid return channel disposed on the base frame to return the cooling fluid to rack liquid return line,
a plurality of cold plates disposed on a bottom surface of the base frame, wherein the cold plates are to be attached to the data processing modules, and
a plurality of fluid distribution channels disposed on a top surface of the base frame to distribute the cooling fluid received from the fluid supply channel to the cold plates to exchange heat generated by the data processing modules and to return the cooling fluid carrying the exchanged heat back to the external cooling fluid source via the fluid return channel, wherein the base frame, the fluid supply and return channels, the fluid distribution channels, and the cold plates are integrated as a single integrated cooling unit comprised of a single piece of material, and wherein all fluid distribution channel connections are internal to the base frame and the fluid supply channel and the fluid return channel are the only external fluid connections to the plurality of fluid distribution channels.

10. The electronic rack of claim 9, wherein the base frame, the fluid supply channel, the fluid return channel, the plurality of cold plates, and the plurality of fluid distribution channels are formed from a single material.

11. The electronic rack of claim 10, wherein the single material comprises aluminum, copper, steel, or titanium.

12. The electronic rack of claim 9, wherein the plurality of cold plates are coupled to the plurality of distribution channels via a permanent coupling.

13. The electronic rack of claim 9, wherein the plurality of fluid distribution channels are located above a top surface of the base frame.

14. The electronic rack of claim 9, wherein the cooling module is adapted for use inside an autonomous vehicle.

15. The electronic rack of claim 9, wherein the plurality of cold plates are arranged in series on the cooling module, such that the cooling fluid passes a first group of cold plates before passing a second group of cold plates.

16. A data center system, comprising:
a room liquid supply line to receive cooling liquid from an external cooling source;
a room liquid return line to return the cooling liquid back to the external cooling source; and
a plurality of electronic racks, wherein each of the electronic racks comprises
a rack manifold having a rack liquid supply line to receive cooling liquid from the room liquid supply line and a rack liquid return line to return warmer liquid back to the room liquid return line, and
a plurality of server blades arranged in a stack, wherein each of the server blades includes a plurality of data processing modules and a cooling module attached to the data processing modules for heat exchanges, wherein the cooling module comprises
a base frame,
a fluid supply channel disposed on the base frame to receive cooling fluid from the rack liquid supply line, wherein the fluid supply channel comprises a tapered manifold that narrows in the direction of fluid flow,
a fluid return channel disposed on the base frame to return the cooling fluid to rack liquid return line,
a plurality of cold plates disposed on a bottom surface of the base frame, wherein the cold plates are to be attached to the data processing modules, and
a plurality of fluid distribution channels disposed on a top surface of the base frame to distribute the cooling fluid received from the fluid supply channel to the cold plates to exchange heat generated by the data processing modules and to return the cooling fluid carrying the exchanged heat back to the external cooling fluid source via the fluid return channel, wherein the base frame, the fluid supply and return channels, the fluid distribution channels, and the cold plates are integrated as a single integrated cooling unit comprised of a single piece of material, and wherein all fluid distribution channel connections are internal to the base frame and the fluid supply channel and the fluid return channel are the only external fluid connections to the plurality of fluid distribution channels.

* * * * *